(12) United States Patent
He et al.

(10) Patent No.: US 8,242,542 B2
(45) Date of Patent: Aug. 14, 2012

(54) SEMICONDUCTOR SWITCHING DEVICE EMPLOYING A QUANTUM DOT STRUCTURE

(75) Inventors: Zhong-Xiang He, Essex Junction, VT (US); Qizhi Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/644,895

(22) Filed: Dec. 22, 2009

(65) Prior Publication Data
US 2010/0213547 A1    Aug. 26, 2010

Related U.S. Application Data

(60) Provisional application No. 61/154,960, filed on Feb. 24, 2009.

(51) Int. Cl.
*H01L 29/76* (2006.01)
(52) U.S. Cl. .................. 257/213; 257/347; 257/E29.07; 257/E29.071; 257/E29.245; 257/E21.404; 438/263; 438/594; 438/962
(58) Field of Classification Search ........... 257/E29.071, 257/E29.07, E29.245, E21.404, 213, 347; 438/263, 264, 594, 962
See application file for complete search history.

(56) References Cited

U.S. PATENT DOCUMENTS

| | | | |
|---|---|---|---|
| 5,828,076 A | 10/1998 | Gossner et al. | |
| 5,963,471 A | 10/1999 | Ohata et al. | |
| 6,091,076 A * | 7/2000 | Deleonibus | 257/24 |
| 6,211,013 B1 | 4/2001 | Park et al. | |
| 6,734,105 B2 | 5/2004 | Kim | |
| 6,800,511 B2 | 10/2004 | Park et al. | |
| 7,005,700 B2 | 2/2006 | Lee | |
| 7,026,642 B2 | 4/2006 | Sandhu | |
| 7,217,620 B2 | 5/2007 | Koh | |
| 7,244,679 B2 | 7/2007 | Koh | |
| 2003/0038315 A1 | 2/2003 | Skotnicki et al. | |
| 2005/0227444 A1 | 10/2005 | Ponomarev et al. | |
| 2006/0255368 A1 * | 11/2006 | Chae et al. | 257/213 |

FOREIGN PATENT DOCUMENTS

| | | | |
|---|---|---|---|
| JP | 5055545 | | 3/1993 |
| JP | 5095111 | | 4/1993 |
| JP | 2005203441 | | 7/2005 |
| WO | WO 0221600 | | 3/2002 |
| WO | WO 02/43109 | * | 5/2002 |

* cited by examiner

*Primary Examiner* — A. Sefer
*Assistant Examiner* — Farid Khan
(74) *Attorney, Agent, or Firm* — Scully, Scott, Murphy & Presser, P.C.; Anthony Canale

(57) ABSTRACT

A semiconductor device includes a semiconductor island having at least one electrical dopant atom and encapsulated by dielectric materials including at least one dielectric material layer. At least two portions of the at least one dielectric material layer have a thickness less than 2 nm to enable quantum tunneling effects. A source-side conductive material portion and a drain-side conductive material portion abuts the two portions of the at least one dielectric material layer. A gate conductor is located on the at least one dielectric material layer between the source-side conductive material portion and the drain-side conductive material portion. The potential of the semiconductor island responds to the voltage at the gate conductor to enable or disable tunneling current through the two portions of the at least one dielectric material layer. Design structures for the semiconductor device are also provided.

21 Claims, 12 Drawing Sheets

SEMICONDUCTOR SWITCHING DEVICE EMPLOYING A QUANTUM DOT STRUCTURE

BACKGROUND

The present invention relates to semiconductor devices employing a quantum dot structure and methods of manufacturing the same.

As dimensions of semiconductor devices scale down to nanometer scale, quantum effects are manifested in semiconductor devices. One type of quantum effect is quantization of electrical charges in the volume of the semiconductor device. For example, a semiconductor cube having a dimension of about 21.5 nm on each side has a total volume of about $10^4$ $nm^3$, which is $10^{-17}$ $cm^3$. Tithe semiconductor cube has a dopant concentration of $10^{17}$ atoms/$cm^3$, a single dopant atom is present in the volume of the semiconductor cube. Dopant concentration levels from about $10^{15}$ atoms/$cm^3$ to about $10^{21}$ atoms/$cm^3$, which are typically employed in semiconductor devices, correspond to numbers of dopant atoms from about $10^{-2}$ to about $10^4$ in such a semiconductor cube.

By forming an isolated semiconductor island having dimensions on the order of tens of nanometers and providing a suitable doping level in the semiconductor material, the number of electrical charges in the isolated semiconductor island may be a single digit number or double digit numbers. In such a structure, quantization of electrical charge is reflected in electrical characteristics of the isolated semiconductor island. Such structures are referred to as "quantum dot" structures in which states of excitons are spatially bound in nanoscale dimensions and display quantum effects.

Scaling of conventional field effect transistors having source and drain regions that abut a body region having an opposite type of doping than the source and drain regions suffer from leakage current in an off state. As the dimensions of the field effect transistor scale down, the off-state leakage current increases. The problem becomes even more complicated when the operational voltage of the field effect transistor is also reduced. Since the voltage swing on the gate of the field effect transistor has a small magnitude, e.g., less than 1.2 V, the ratio between the on-current and the off-current of the transistor decreases with the scaling of physical dimensions and reduction of the operational voltage. A semiconductor chip containing such field effect transistors consumes a large amount of power even in an off-state. Thus, scaling of conventional field effect transistors for low power applications face a tremendous challenge.

In view of the above, there exists a need for a semiconductor device that offers an equivalent functionality of a metal-oxide-semiconductor field effect transistor (MOSFET) having dimensions on a nanometer scale and providing a low leakage current, and methods of manufacturing the same.

SUMMARY

The present invention provides a semiconductor device for providing electronic switching employing a quantum dot structure.

In the present invention, a semiconductor island including at least one electrical dopant atom is formed on an insulator layer. The semiconductor island is encapsulated by the top surface of the insulator layer, at least one dielectric material layer, and optionally by at least one shallow trench isolation structure. At least two portions of the at least one dielectric material layer have a thickness less than 2 nm to enable quantum tunneling effects. A conductive material is deposited directly on the two portions of the at least one dielectric material layer and patterned to form a source-side conductive material portion and a drain-side conductive material portion. A gate conductor is formed on the at least one dielectric material layer. The potential of the semiconductor island responds to the voltage at the gate conductor to enable or disable tunneling current through the two portions of the at least one dielectric material layer between the semiconductor island and each of the source-side and drain side conductive material portion.

According to an aspect of the present invention, a semiconductor structure is provided, which includes: a semiconductor portion including at least one dopant atom and abutting, and encapsulated by, a first dielectric material portion having a first thickness, second and third dielectric material portions having a second thickness, at least one shallow trench isolation structure, and a top surface of an insulator layer; a gate conductor abutting the first dielectric material portion; a source-side conductive material portion vertically abutting the second dielectric material portion; and a drain-side conductive material portion vertically abutting the third dielectric material portion, wherein the second thickness is less than 2 nm to enable quantum tunneling of electrical current.

According to another aspect of the present invention, another semiconductor structure is provided, which includes: a semiconductor portion including at least one dopant atom and abutting, and encapsulated by a dielectric material layer and a top surface of an insulator layer; a gate conductor vertically abutting a first portion of the dielectric material layer; a source-side conductive material portion laterally abutting a second portion of the dielectric material layer; and a drain-side conductive material portion laterally abutting a third portion of the dielectric material layer, wherein the dielectric material layer has a thickness less than 2 nm to enable quantum tunneling of electrical current.

According to yet another aspect of the present invention, yet another semiconductor structure is provided, which includes: a semiconductor portion including at least one dopant atom and abutting, and encapsulated by, a first dielectric material portion having a first thickness, second and third dielectric material portions having a second thickness, and a top surface of an insulator layer; a gate conductor abutting the first dielectric material portion; a source-side conductive material portion laterally abutting the second dielectric material portion; and a drain-side conductive material portion laterally abutting the third dielectric material portion, wherein the second thickness is less than 2 nm to enable quantum tunneling of electrical current.

According to still another aspect of the present invention, a design structure embodied in a machine readable medium for designing, manufacturing, or testing a design for a semiconductor structure is provided. The design structure includes: a first data representing a semiconductor portion including at least one dopant atom and abutting, and encapsulated by, dielectric materials including a first dielectric material portion, a second dielectric material portion, a third dielectric material portion, and an insulator layer located directly underneath; a second data representing a gate conductor abutting the first dielectric material portion; a third data representing a source-side conductive material portion abutting the second dielectric material portion; and a fourth data representing a drain-side conductive material portion abutting the third dielectric material portion, wherein the second dielectric material portion and the third dielectric material portion have a thickness less than 2 nm to enable quantum tunneling of electrical current.

According to a further aspect of the present invention, a method of forming a semiconductor structure is provided. The method includes: forming a semiconductor portion including at least one dopant atom directly on an insulator layer; forming a stack of a first dielectric material portion and a gate conductor directly on a portion of a top surface of the semiconductor portion; forming second and third dielectric material portions directly on exposed top surfaces of the semiconductor portion; forming a source-side conductive material portion directly above the second dielectric material portion; and forming a drain-side conductive material portion directly above the third dielectric material portion, wherein the second and third dielectric material portions have a thickness less than 2 nm to enable quantum tunneling of electrical current.

According to an even further aspect of the present invention, another method of forming a semiconductor structure is provided. The method includes: forming a semiconductor portion including at least one dopant atom directly on an insulator layer; forming a dielectric material layer directly on the semiconductor portion, wherein the dielectric material layer and the insulator layer encapsulate the semiconductor portion; forming a gate conductor directly on a first portion of the dielectric material layer; forming a source-side conductive material portion directly on a second portion of the dielectric material layer; and forming a drain-side conductive material portion directly on a third portion of the dielectric material layer, wherein the dielectric material layer has a thickness less than 2 nm to enable quantum tunneling of electrical current.

According to a yet further aspect of the present invention, yet another method of forming a semiconductor structure is provided, which includes: forming a vertical stack of first dielectric material portion and a gate conductor directly on a semiconductor layer; forming a dielectric gate spacer directly on sidewalls of the gate conductor; anisotropically etching the semiconductor layer to form a semiconductor portion, wherein outer sidewalls of the dielectric gate spacer is substantially vertically coincident with sidewalls of the semiconductor portion; forming a second dielectric material portion directly on a sidewall of the semiconductor portion and a third dielectric material portion directly on another sidewall of the semiconductor portion; forming a source-side conductive material portion directly on the second dielectric material portion; and forming a drain-side conductive material portion directly on the third dielectric material portion, wherein the second and third dielectric material portions have a thickness less than 2 nm to enable quantum tunneling of electrical current.

According to still further aspect of the present invention, a design structure embodied in a machine readable medium for designing, manufacturing, or testing a design for a semiconductor structure is provided. The design structure includes: a first data representing a semiconductor portion including at least one dopant atom and abutting, and encapsulated by, dielectric materials including a first dielectric material portion, a second dielectric material portion, a third dielectric material portion, and an insulator layer located directly underneath; a second data representing a gate conductor abutting the first dielectric material portion; a third data representing a source-side conductive material portion abutting the second dielectric material portion; and a fourth data representing a drain-side conductive material portion abutting the third dielectric material portion, wherein the second dielectric material portion and the third dielectric material portion have a thickness less than 2 nm to enable quantum tunneling of electrical current.

DETAILED DESCRIPTION

As stated above, the present invention relates to semiconductor devices employing a quantum dot structure and methods of manufacturing the same, which are described herein with accompanying figures. The drawings are not necessarily drawn to scale.

Figure 1:
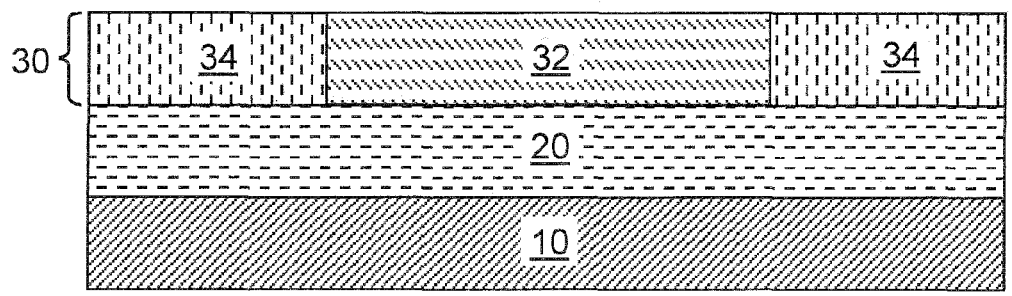
FIGS. 1-8 are sequential vertical cross-sectional views of a first exemplary semiconductor structure according to a first embodiment of the present invention at various stages of a manufacturing process.

Referring to FIG. 1, a first exemplary semiconductor structure according to a first embodiment of the present invention comprises a semiconductor-on-insulator (SOI) substrate comprising a handle substrate 10, a buried insulator layer 20, and a top semiconductor layer 30. At least one shallow trench isolation structure 34 comprising a dielectric material is patterned into the top semiconductor layer 30 by formation of at least one shallow trench, filling of the at least one shallow trench with a dielectric material, and planarization of the dielectric material. The at least one shallow trench laterally surrounds an island of the semiconductor material in the top semiconductor layer 30 prior to patterning. Upon formation of the at least one shallow trench isolation structure 34, the remaining portion of the original semiconductor material of the top semiconductor layer 30 is laterally surrounded by the at least one shallow trench isolation structure 34. The remaining portion of the original semiconductor material of the top semiconductor layer 30 is herein referred to as a semiconductor portion 32.

The handle substrate 10 may comprise a semiconductor material, an insulator material, or a metallic material. For example, the handle substrate may comprise single crystalline semiconductor material such as silicon. The buried insulator layer 20 comprises a dielectric material such as silicon oxide or silicon nitride. The original material of the top semiconductor layer 30 prior to formation of the at least one shallow trench isolation structure 34, and hence the semiconductor portion 32, comprise a semiconductor material. Preferably, the semiconductor portion 32 comprises a single crystalline semiconductor material having an epitaxial alignment among atoms within the entirety of the semiconductor portion 34. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. The thickness of the top semiconductor layer 30 may be from about 5 nm to about 200 nm, and typically from about 10 nm to about 100 nm, although lesser and greater thicknesses are also contemplated herein.

The semiconductor portion 32 may be doped with electrical dopants of a first conductivity type. In case the first conductivity type is p-type, the electrical dopants may be at least one of p-type dopants such as B, Ga, and In. In case the first conductivity type is n-type, the electrical dopants may be at least one of n-type dopants such as P, As, and Sb. Typically, the concentration of the electrical dopants may be from about $1.0 \times 10^{14}$ atoms/cm$^3$ to about $1.0 \times 10^{19}$ atoms/cm$^3$, although lesser and greater concentrations are also contemplated herein.

The volume of the semiconductor portion 32 may be from about $10^2$ nm$^3$ to about $10^9$ nm$^3$, and preferably from about $10^3$ nm$^3$ to about $10^7$ nm$^3$, although lesser and greater volumes are also contemplated herein. Typical lateral dimensions, e.g., length and width, of the semiconductor portion 32 may be from about 5 nm to about 2,000 nm, and typically from about 10 nm to about 100 nm, although lesser and greater dopant concentrations are also contemplated herein. The total number dopants of the first conductivity in the semiconductor portion 32 is obtained by multiplying the volume of the semiconductor portion 32 and the dopant concentration of the semiconductor portion 32, and is less than about 100. The total number of dopants of the first conductivity type in the semiconductor portion 32 may be from 1 to about 50, and typically from about 10 to about 25.

Figure 2:
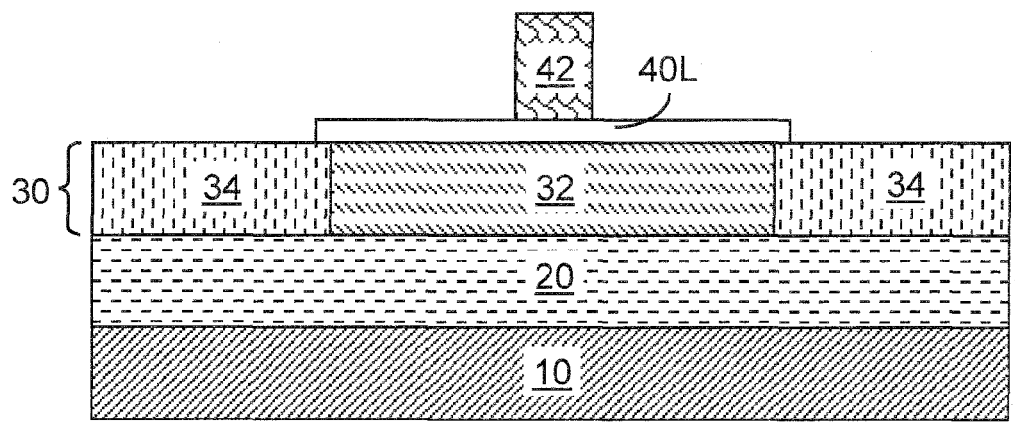

Referring to FIG. 2, a first dielectric layer 40L is formed on the exposed top surface of the semiconductor portion 32. The first dielectric layer 40L may comprise a semiconductor-based dielectric material such as silicon oxide, silicon nitride, silicon oxynitride, and/or a stack thereof. The semiconductor-based dielectric material may be formed by thermal conversion of exposed portions of the semiconductor portion 32 and/or by chemical vapor deposition (CVD). Alternately, the first dielectric layer 40L may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD), etc. The thickness of the first dielectric layer 40L may be from about 1 nm to about 3 nm in the case of a conventional dielectric material, and from about 2 nm to about 6 nm in the case of the high-k dielectric material, and may have an effective oxide thickness on the order of or less than 1 nm.

A gate conductor layer comprising a conductive material is deposited on the first dielectric layer 40L, and is lithographically patterned to form a gate conductor 42 overlying a middle portion of the semiconductor portion 32. For example, the gate conductor 42 may be formed such that the semiconductor portion 32 comprises a first sub-portion underlying the grate conductor 42 and a second and a third sub-portion that do not underlie the gate conductor 42. The width of the gate conductor 42 in the plane of FIG. 2 is less than the width of the semiconductor portion 32 in the plane of FIG. 2.

The gate conductor 42 comprises a conductive material such as a doped semiconductor material, a conductive metallic nitride, a metallic material, or a combination thereof. Exemplary doped semiconductor materials include doped polysilicon, a doped silicon-containing semiconductor alloy, etc. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The thickness of the gate conductor 42 may be from about 20 nm to about 300 nm, and typically from about 40 nm to about 120 nm, although lesser and greater thicknesses are also contemplated herein explicitly.

Figure 3:
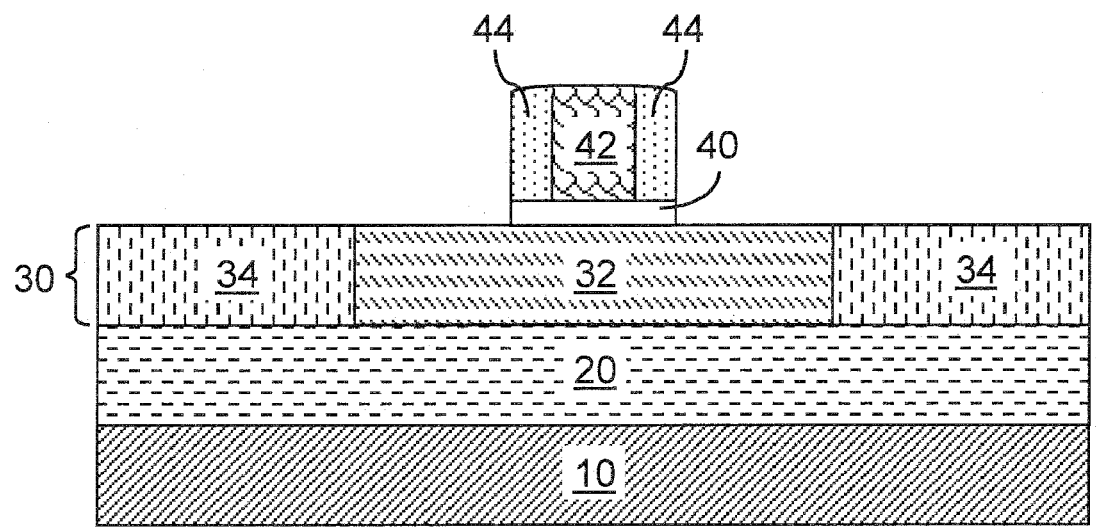

Referring to FIG. 3, a dielectric gate spacer 44 is formed on the sidewalls of the gate conductor 42 by deposition of a conformal dielectric layer and an anisotropic etch that removes horizontal portions of the conformal dielectric layer. The remaining portion of the conformal dielectric layer after the anisotropic etch constitutes the dielectric gate spacer 44, which laterally surrounds the gate conductor 42. The dielectric gate spacer 44 may be topologically homeomorphic to a torus, i.e., may be continually stretched and bended into the shape of a torus without forming or destroying singularities such as a hole.

Once the horizontal portions of the conformal dielectric layer are removed, the exposed portions of the first dielectric layer 40L are removed by an etch, which may be an anisotropic etch or an isotropic etch. The remaining portion of the first dielectric layer 40L constitutes a first dielectric material portion 40 having a first thickness. The first thickness is the same as the thickness of the first dielectric layer 40L. Bottom surfaces of the dielectric gate spacer 44 abut a top surface of the first dielectric portion 40. Preferably, the etch that removes the exposed portions of the first dielectric layer 40L is selective to the semiconductor portion 32.

Figure 4:
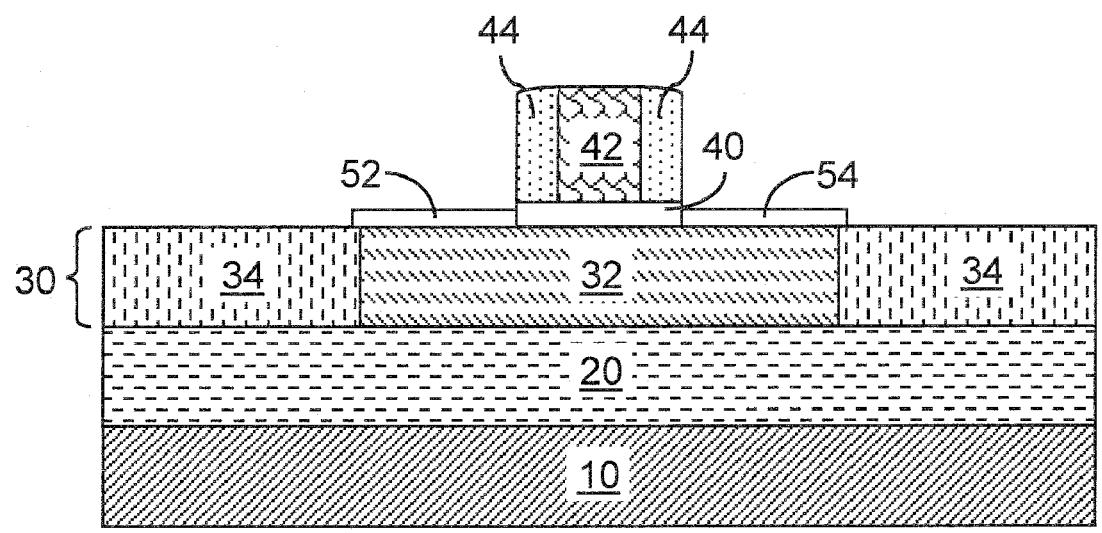

Referring to FIG. 4, a second dielectric material portion 52 and a third dielectric material portion 54 are formed directly on the exposed top surfaces of the semiconductor portion. The second dielectric material portion 52 is formed directly on the top surface of the second sub-portion of the semiconductor portion 32, and the third dielectric material portion 54 is formed directly on the top surfaces of the third sub-portion of the semiconductor portion 32.

The second dielectric material portion 52 and the third dielectric material portion 54 may comprise a semiconductor-based dielectric material such as silicon oxide, silicon nitride, silicon oxynitride, and/or a stack thereof. The semiconductor-based dielectric material may be formed by thermal conversion of exposed portions of the semiconductor portion 32 and/or by chemical vapor deposition (CVD). In this case, the second dielectric material portion 52 and the third dielectric material portion 54 are two disjoined, i.e., non-abutting, structures that are formed only on the exposed surfaces of the semiconductor portion 32. Alternately, the second dielectric material portion 52 and the third dielectric material portion 54 may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thererof. In this case, the second dielectric material portion 52 and the third dielectric material portion 54 are portions of a single contiguous dielectric material layer that covers the entirety of the top surfaces and the sidewall surfaces of the first exemplary semiconductor structure. A dielectric material portion that may be formed directly on the gate conductor 42 in some cases is omitted in FIG. 4.

The second dielectric material portion 52 and the third dielectric material portion 54 have the same thickness. The thickness of the second dielectric material portion 52 and the third dielectric material portion 54 may be from about 0.3 nm to about 2 nm to enable quantum tunneling of electrical current therethrough. Since the quantum tunneling of electrical current increases exponentially with the inverse of the thickness of a dielectric material portion, the control of the thickness of the second dielectric material portion 52 and the third dielectric material portion 54 below 2 nm is needed to enable significant quantum tunneling current. Preferably, the thickness of the second dielectric material portion 52 and the third dielectric material portion 54 is from about 0.5 nm to about 1.2 nm.

The buried insulator layer 20, the at least one shallow trench isolation region 34, and the first, second, and third dielectric material portions (40, 52, 54) collectively encapsulate the semiconductor portion 32.

Figure 5:
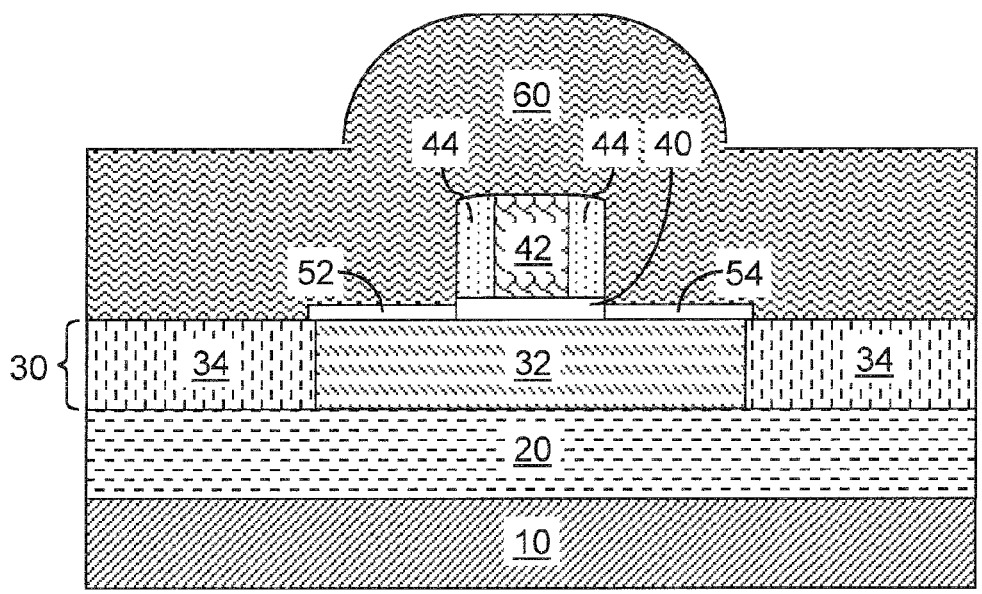

Referring to FIG. 5, a conductive material layer 60 is deposited over the top surfaces of the first exemplary semiconductor structure. The conductive material layer 60 comprises a conductive material such as a doped semiconductor material or a metallic material. For example, the conductive material layer 60 may comprise a doped semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Alternately or in addition, the conductive material layer 60 may comprises a metallic material such as conductive metallic nitrides, elemental metals, intermetallic alloys, and a combination thereof. The thickness of the conductive material layer 60, as measured above the top surface of the at least one shallow trench isolation structure 34, is greater than the sum of the thickness of the first dielectric material portion 40 and the thickness of the gate conductor 42.

Figure 6:
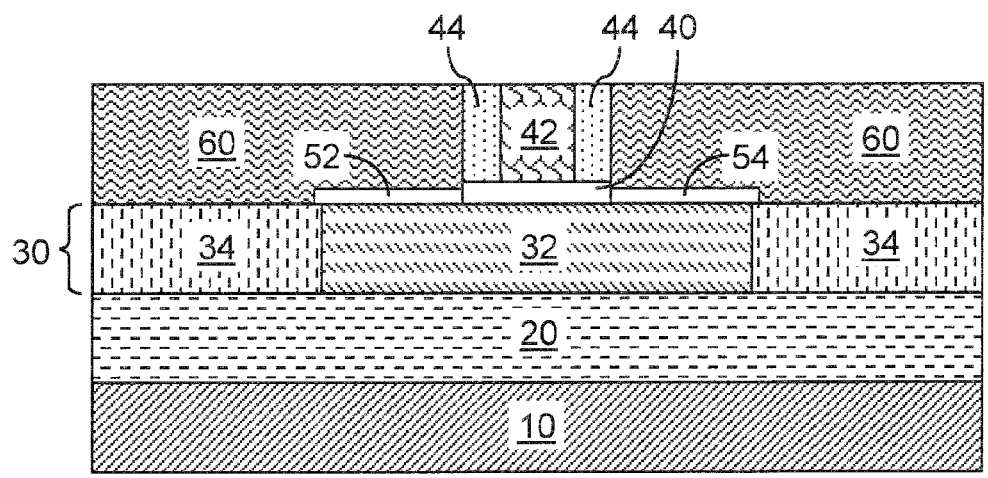

Referring to FIG. 6, the conductive material layer 60 is planarized at least down to the top surface of the dielectric gate spacer 44. The dielectric gate spacer 44 may be employed as a stopping layer for the planarization process. An upper portion of the dielectric gate spacer and an upper portion of the gate conductor 42 may be polished during the planarization process. After planarization, the top surface of the conductive material layer 60, the top surface of the gate conductor 42, and the top surface of the dielectric gate spacer 44 are substantially coplanar and horizontal.

Figure 7:
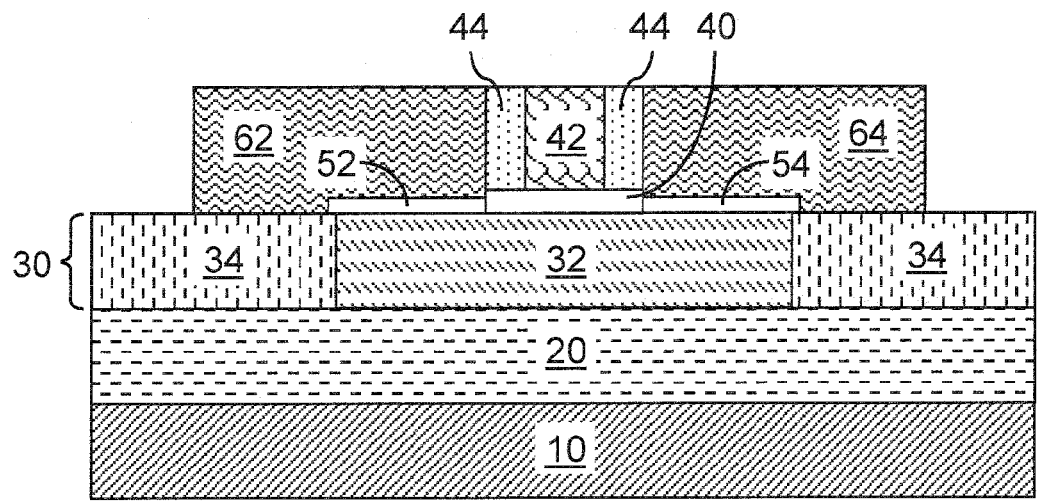

Referring to FIG. 7, the conductive material layer 60 is lithographically patterned to form a source-side conductive material portion 62 abutting the second dielectric material portion 52 and a drain-side conductive material portion 64 abutting the third dielectric material portion 54. Typically, an edge of each of the source-side conductive material portion 62 and the drain-side conductive material portion 64 overlies the at least one shallow trench isolation structure 34.

Figure 8:
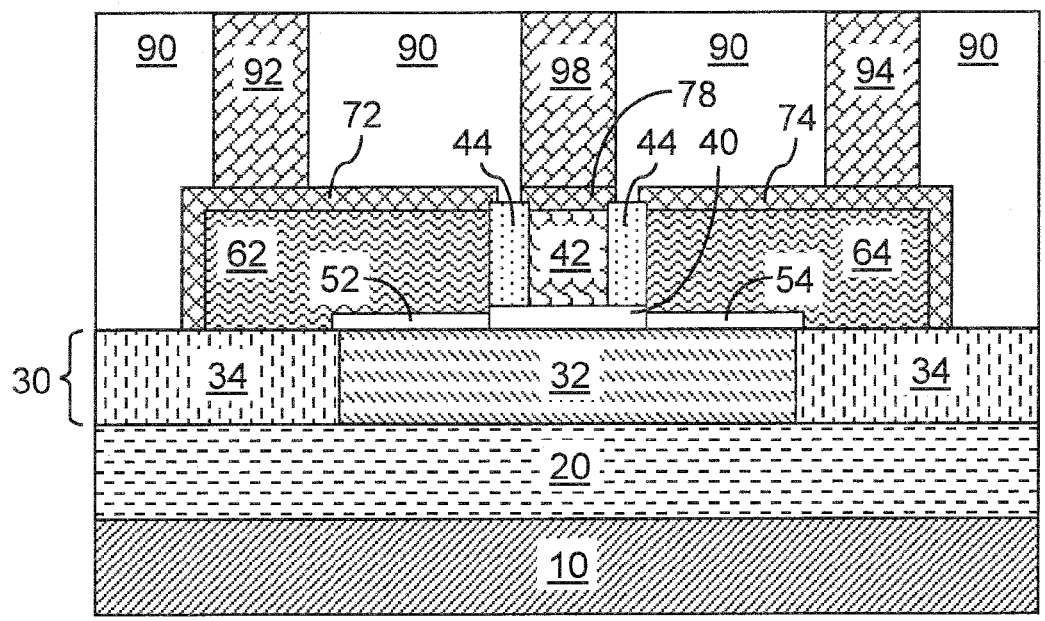

Referring to FIG. 8, metal semiconductor alloy regions are formed on exposed semiconductor surfaces of the first exemplary semiconductor structure. The metal semiconductor alloy regions may be formed, for example, by deposition of a metal layer on the exposed semiconductor surfaces and reacting the metal layer with the semiconductor material underneath. The metal semiconductor alloy regions are formed only on semiconductor surfaces, i.e., if the underlying surface comprises a metal or a dielectric material, no metal semiconductor alloy is formed.

A source-side metal semiconductor alloy region 72 is formed directly on the surface of the source-side conductive material portion 62 if the source-side conductive material portion 62 comprises a semiconductor material. The source-side metal semiconductor alloy region 72 also abuts the at least one shallow trench isolation structure 34. The source-side metal semiconductor alloy region 72 abuts one side of the dielectric gate spacer 44. A drain-side metal semiconductor alloy region 74 is formed directly on the surface of the drain-side conductive material portion 64 if the drain-side conductive material portion 64 comprises a semiconductor material. The drain-side metal semiconductor alloy region 74 also abuts the at least one shallow trench isolation structure 34. The drain-side metal semiconductor alloy region 74 abuts the other side of the dielectric gate spacer 44. A gate-side metal semiconductor alloy region 78 is formed directly on the top surface of the gate conductor 42 if the gate conductor 42 comprises a semiconductor material. The gate-side metal semiconductor alloy region 78 abuts the dielectric gate spacer 44.

A middle-of-line (MOL) dielectric layer 90 is formed over the gate-side metal semiconductor alloy region 78, source-side metal semiconductor alloy region 72, the drain-side metal semiconductor alloy region 74, the dielectric gate spacer 44, and the at least one shallow trench isolation structure 34. The MOL dielectric layer 90 may comprise a silicon oxide, a silicon nitride, a chemical vapor deposition (CVD) low-k dielectric material, a spin-on low-k dielectric material, or a stack thereof. The MOL dielectric layer 90 may contain a mobile ion diffusion barrier layer that prevents diffusion of mobile ions such as sodium and potassium from back-end-of-line (BEOL) dielectric layers. Further, the MOL dielectric layer 90 may contain a stress liner that applies tensile or compressive stress on underlying structures to alter charge carrier mobility in the semiconductor portion 32.

Contact via holes are formed in the MOL dielectric layer 90 and filled with metal to form various metal contacts. For example, a source-side contact via 92 vertically abutting the source-side metal semiconductor alloy region 72 and a drain-side contact via 94 vertically abutting the drain-side metal semiconductor alloy region 74 may be formed. Further, a gate-side contact via 98 vertically abutting the gate-side metal semiconductor alloy region 78 may be formed.

The electrical charge and the number of excitons in the semiconductor portion 32 are quantized. When the voltage on the gate conductor 42 removes electrical charges and excitons from the semiconductor portion 32, the electrical current through the source-side conductive material portion 62, the second dielectric material portion 52, the semiconductor portion 32, the third dielectric material portion 54, and the drain-side conductive material portion 64 is low. When the voltage on the gate conductor 42 is set to provide electrical charges and excitons in the semiconductor portion 32, electrical current tunnels through the second gate dielectric portion 52 and through the third gate dielectric portion 54. The tunneling current changes exponentially with the voltage on the gate conductor 42. Further, the tunneling current may also be controlled by the potential difference between the source-side conductive material portion 62 and the drain-side conductive material portion 64. Therefore, the semiconductor switching device in the first exemplary semiconductor structure of the present invention provides a low leakage switching device that provides effective switching even at low operational voltages, e.g., below 0.9 V.

Figure 9:
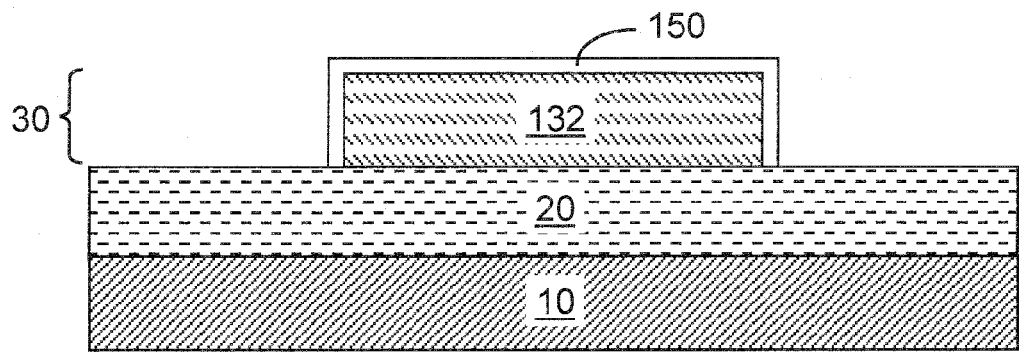
FIGS. 9-13 are sequential vertical cross-sectional views of a second exemplary semiconductor structure according to a second embodiment of the present invention at various stages of a manufacturing process.

Referring to FIG. 9, a second exemplary semiconductor structure according to a second embodiment of the present invention comprises a semiconductor-on-insulator (SOI) substrate comprising a handle substrate 10, a buried insulator layer 20, and a top semiconductor layer 30 as in the first embodiment. Each of the handle substrate 10, the buried insulator layer 20, and the top semiconductor layer 30 may comprise the same material as in the first embodiment. The top semiconductor layer 30 is patterned to form a semiconductor portion 132, which is structurally and compositionally the same as the semiconductor portion 32 of the first embodiment. The total number of dopants of the first conductivity type in the semiconductor portion 132 may be from 1 to about 50, and typically from about 10 to about 25, as in the first embodiment.

A dielectric material layer 150 is formed on the exposed surfaces of the semiconductor portion 132 including a top surface and sidewalls. The buried insulator layer 20 and the dielectric material layer 50 encapsulate the semiconductor portion 132. The dielectric material layer 150 may comprise the same material as, and has the same thickness as, the second dielectric material portion 52 and the third dielectric material portion of the first embodiment. For example, the dielectric material layer 150 may comprise a semiconductor-based dielectric material such as silicon oxide, silicon nitride, silicon oxynitride, and/or a stack thereof. The semiconductor-based dielectric material may be formed by thermal conversion of exposed portions of the semiconductor portion 32 and/or by chemical vapor deposition (CVD). Alternately, the dielectric material layer 150 may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The second dielectric material portion 52 and the third dielectric material portion 54 have the same thickness. The thickness of the dielectric material layer 150 may be from about 0.3 nm to about 2 nm to enable quantum tunneling of electrical current therethrough as in the first embodiment. Preferably, the thickness of the dielectric material layer 150 is from about 0.5 nm to about 1.2 nm.

Figure 10:
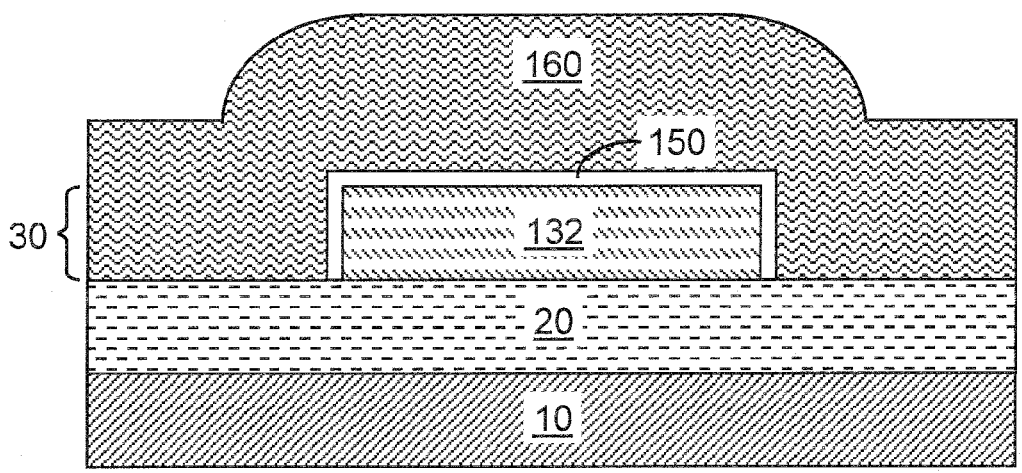

Referring to FIG. 10, a conductive material layer 160 is deposited over the top surfaces of the second exemplary semiconductor structure. The conductive material layer 160 may comprise the same material as the conductive material layer 60 of the first embodiment. The thickness of the conductive material layer 160, as measured above the top surface of the buried insulator layer 20, is greater than the sum of the thickness of the dielectric material layer 150 and the thickness of the semiconductor portion 132.

Figure 11:
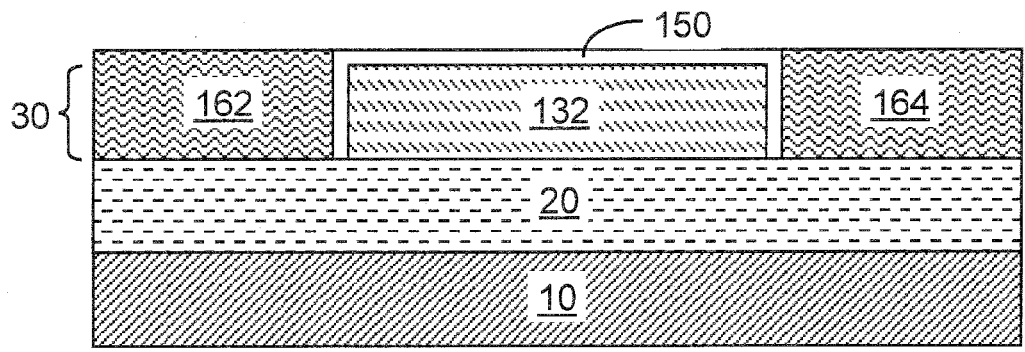

Referring to FIG. 11, the conductive material layer 160 is planarized employing the top surface of the dielectric material layer 150 as a stopping layer. After planarization, the top surface of the conductive material layer 60 is substantially coplanar with the top surface of the conductive material layer 160. The conductive material layer 160 may be lithographically patterned to form a source-side conductive material portion 162 abutting a first sidewall of the dielectric material layer 150 and a drain-side conductive material portion 164 abutting another sidewall of the dielectric material layer 150.

Figure 12:
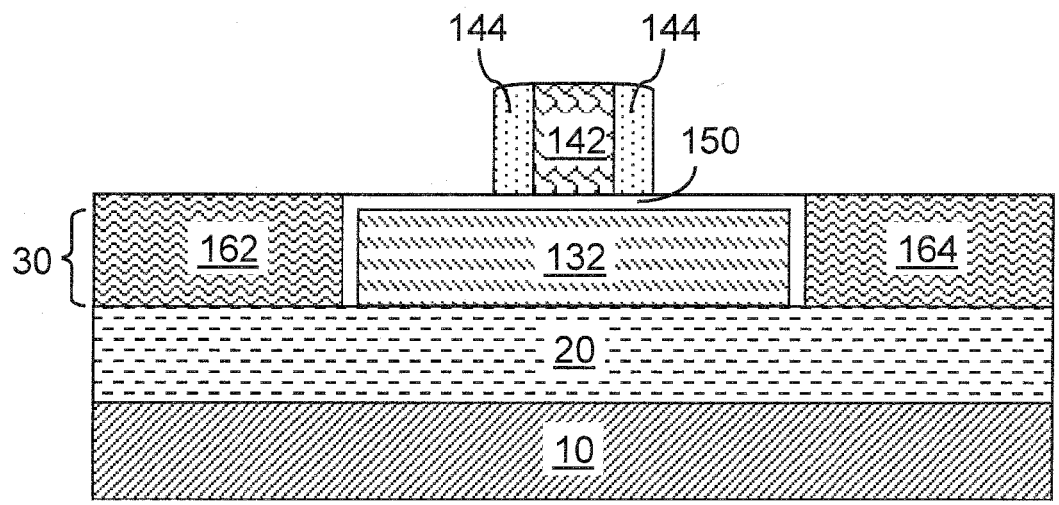

Referring to FIG. 12, a gate conductor layer (not shown) comprising a conductive material is deposited on the surface of the dielectric material layer 150, the source-side conductive material portion 162, and the drain-side conductive material portion 164, and is lithographically patterned to form a gate conductor 142 overlying a middle portion of the semiconductor portion 132. For example, the gate conductor 142 may be formed such that the semiconductor portion 132 comprises a first sub-portion underlying the grate conductor 142 and a second and a third sub-portion that do not underlie the gate conductor 142. The width of the gate conductor 142 in the plane of FIG. 12 is less than the width of the semiconductor portion 132 in the plane of FIG. 12. The material of the gate conductor layer may be removed from above the source-side conductive material portion 162 and the drain-side conductive material portion 164.

The gate conductor 142 comprises a conductive material such as a doped semiconductor material, a conductive metallic nitride, a metallic material, or a combination thereof as in the first embodiment. The thickness of the gate conductor 142 may be from about 20 nm to about 300 nm, and typically from about 40 nm to about 120 nm, although lesser and greater thicknesses are also contemplated herein explicitly. In case the gate conductor layer comprises a different material than the source-side conductive material portion 162 and the drain-side conductive material portion 164, the material of the gate conductor layer may be removed selective to the material of the source-side conductive material portion 162 and the drain-side conductive material portion 164.

A dielectric gate spacer 144 is formed on the sidewalls of the gate conductor 142 by deposition of a conformal dielectric layer and an anisotropic etch that removes horizontal portions of the conformal dielectric layer. The remaining portion of the conformal dielectric layer after the anisotropic etch constitutes the dielectric gate spacer 144, which laterally surrounds the gate conductor 142. The dielectric gate spacer 144 may have the same composition as the dielectric gate spacer 144 of the first embodiment. Preferably, the removal of the horizontal portions of the conformal dielectric layer is selective to the dielectric material layer 150.

Figure 13:
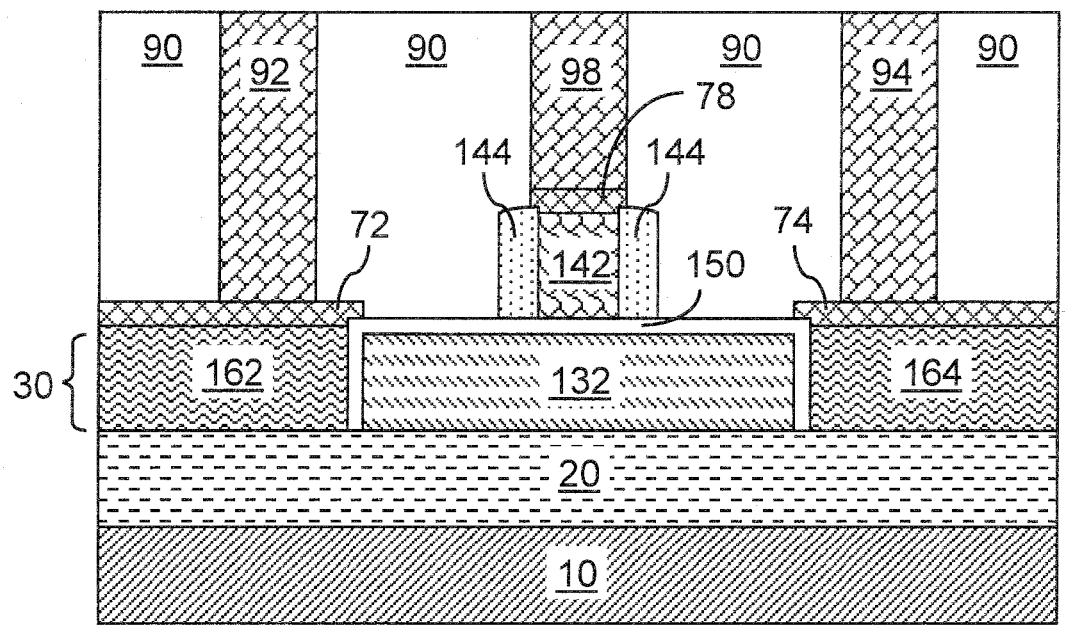

Referring to FIG. 13, metal semiconductor alloy regions are formed on exposed semiconductor surfaces of the second exemplary semiconductor structure. The metal semiconductor alloy regions may be formed in the same manner as in the first embodiment.

A source-side metal semiconductor alloy region 72 is formed directly on the surface of the source-side conductive material portion 162 if the source-side conductive material portion 162 comprises a semiconductor material. The source-side metal semiconductor alloy region 72 abuts the dielectric material layer 150. A drain-side metal semiconductor alloy region 74 is formed directly on the surface of the drain-side conductive material portion 164 if the drain-side conductive material portion 164 comprises a semiconductor material. The drain-side metal semiconductor alloy region 74 abuts the dielectric material layer 150. A gate-side metal semiconductor alloy region 78 is formed directly on the top surface of the gate conductor 142 if the gate conductor 142 comprises a semiconductor material. The gate-side metal semiconductor alloy region 78 abuts the dielectric gate spacer 144.

A middle-of-line (MOL) dielectric layer 90 is formed over the gate-side metal semiconductor alloy region 78, source-side metal semiconductor alloy region 72, the drain-side metal semiconductor alloy region 74, the dielectric gate spacer 44, and the dielectric material layer 150. The MOL dielectric layer 90 may comprise the same material as in the first embodiment.

Contact via holes are formed in the MOL dielectric layer 90 and filled with metal to form various metal contacts. For example, a source-side contact via 92 vertically abutting the source-side metal semiconductor alloy region 72 and a drain-side contact via 94 vertically abutting the drain-side metal semiconductor alloy region 74 may be formed. Further, a gate-side contact via 98 vertically abutting the gate-side metal semiconductor alloy region 78 may be formed.

The electrical charge and the number of excitons in the semiconductor portion 132 is quantized. When the voltage on the gate conductor 142 removes electrical charges and excitons from the semiconductor portion 132, virtually no current flows through the semiconductor portion 132. When the voltage on the gate conductor 42 is set to provide electrical charges and excitons in the semiconductor portion 32, the electrical current tunnels through a first sidewall portion of the dielectric material layer 150 between the source-side conductive material portion 162 and the semiconductor portion 132, flows through the semiconductor portion 132, and tunnels through the second sidewall portion of the dielectric material layer 150 between the semiconductor portion 132 and the drain-side conductive material portion 164. The tunneling current changes exponentially with the voltage on the gate conductor 142. Further, the tunneling current may also be controlled by the potential difference between the source-side conductive material portion 162 and the drain-side conductive material portion 164. Therefore, the semiconductor switching device in the second exemplary semiconductor structure of the present invention provides a low leakage switching device that provides effective switching even at low operational voltages, e.g., below 0.9 V.

Figure 14:
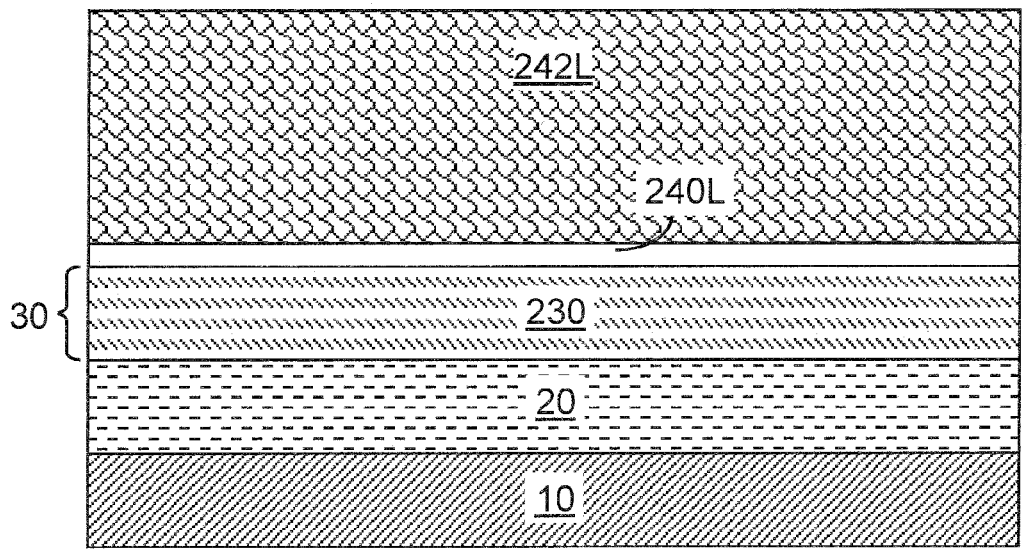
FIGS. 14-21 are sequential vertical cross-sectional views of a third exemplary semiconductor structure according to a third embodiment of the present invention at various stages of a manufacturing process.

Referring to FIG. 14, a third exemplary semiconductor structure according to a third embodiment of the present invention comprises a semiconductor-on-insulator (SOI) substrate comprising a handle substrate 10, a buried insulator layer 20, and a top semiconductor layer 30 as in the first and second embodiment of the present invention. Each of the handle substrate 10, the buried insulator layer 20, and the top semiconductor layer 30 may be the same as in the first and second embodiments. The top semiconductor layer 30 comprises a contiguous semiconductor portion 230 that extends over the entirety of the buried insulator layer 20.

A first dielectric layer 240L is formed on the exposed top surface of the top semiconductor layer. The first dielectric layer 240L may comprise the same dielectric material as, and have the same thickness as, the first dielectric layer 40L of the first embodiment.

A gate conductor layer 242L comprising a conductive material is deposited on the first dielectric layer 240L. The gate conductor layer 242L comprises a conductive material such as a doped semiconductor material, a conductive metallic nitride, a metallic material, or a combination thereof. The composition and thickness of the gate conductor layer 242L may be the same as the composition and thickness of the gate conductor layer of the first embodiment.

Figure 15:
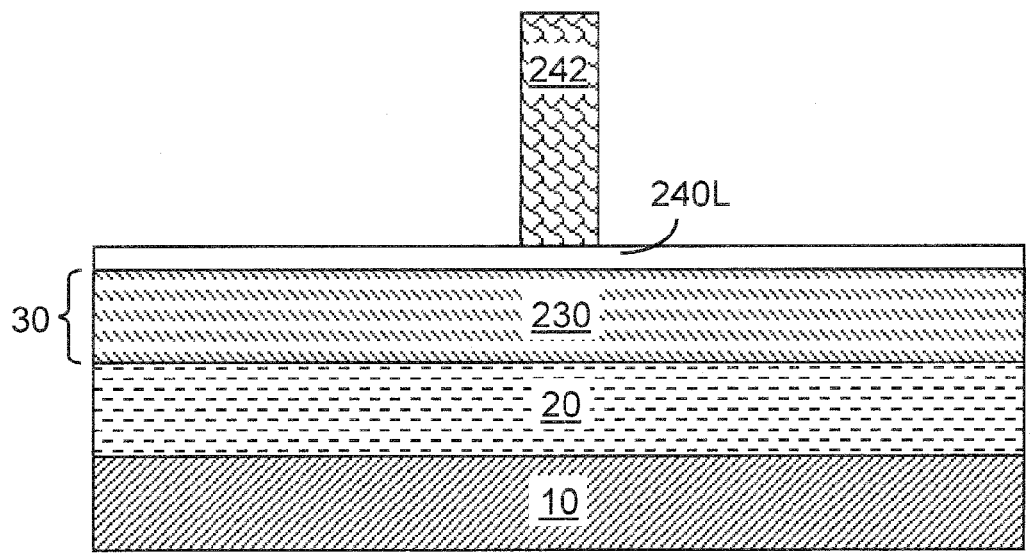

Referring to FIG. 15, the gate conductor layer 242L is lithographically patterned to form a gate conductor 242. Preferably, the anisotropic etch employed to pattern the gate conductor 242 is selective to the first dielectric layer 240L.

Figure 16:
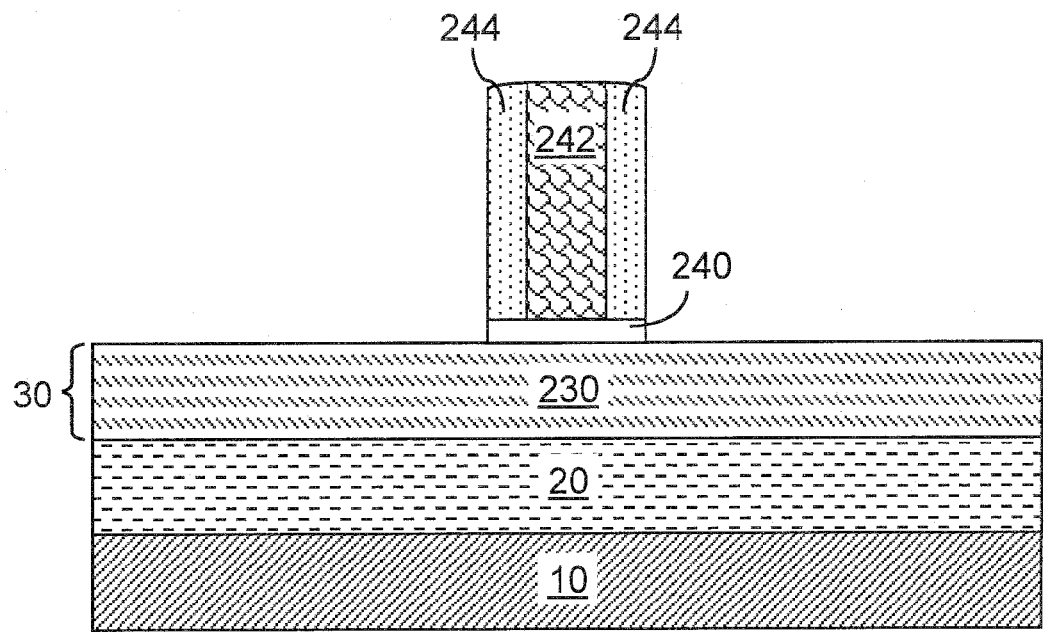

Referring to FIG. 16, a dielectric gate spacer 244 is formed on the sidewalls of the gate conductor 242 by deposition of a conformal dielectric layer and an anisotropic etch that removes horizontal portions of the conformal dielectric layer. The remaining portion of the conformal dielectric layer after the anisotropic etch constitutes the dielectric gate spacer 244, which laterally surrounds the gate conductor 242. The dielectric gate spacer 244 may be topologically homeomorphic to a torus.

Once the horizontal portions of the conformal dielectric layer are removed, the exposed portions of the first dielectric layer 240L are removed by an etch, which may be an anisotropic etch or an isotropic etch. The remaining portion of the first dielectric layer 240L constitutes a first dielectric material portion 240 having a first thickness. The first thickness is the same as the thickness of the first dielectric layer 240L. Bottom surfaces of the dielectric gate spacer 244 abut a top surface of the first dielectric portion 240. Preferably, the etch that removes the exposed portions of the first dielectric layer 240L is selective to the semiconductor material of the top semiconductor layer 30.

Figure 17:
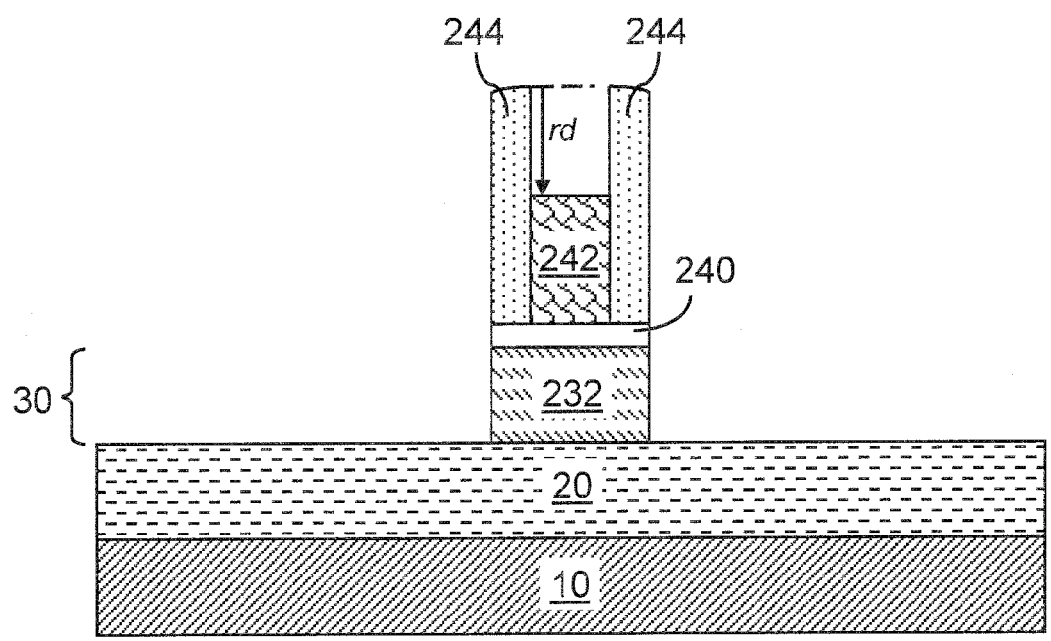

Referring to FIG. 17, an anisotropic etch is performed employing the gate dielectric spacer 244 as an etch mask. The exposed portions of the contiguous semiconductor portion 230 is removed by the anisotropic etch. The remaining portion of the contiguous semiconductor portion 230, which underlies the stack of the first dielectric portion 240 and the assembly of the gate conductor 242 and the dielectric gate spacer 244, constitute a semiconductor portion 232. Like the semiconductor portion 32 of the first embodiment and the semiconductor portion 132 of the second embodiment, the volume of the semiconductor portion 232 may be from about $10^2$ nm$^3$ to about $10^9$ nm$^3$, and preferably from about $10^3$ nm$^3$ to about $10^7$ nm$^3$, although lesser and greater volumes are also contemplated herein. Typical lateral dimensions, e.g., length and width, of the semiconductor portion 232 may be from about 5 nm to about 2,000 nm, and typically from about 10 nm to about 100 nm, although lesser and greater dopant concentrations are also contemplated herein. The total number dopants of the first conductivity in the semiconductor portion 232 is obtained by multiplying the volume of the semiconductor portion 232 and the dopant concentration of the semiconductor portion 232, and is less than about 100. The total number of dopants of the first conductivity type in the semiconductor portion 232 may be from 1 to about 50, and typically from about 10 to about 25.

The outer sidewalls of the gate spacer 244, the sidewalls of the first dielectric portion 240, and the sidewalls of the semiconductor portion 232 are substantially vertically coincident. In one case, the material of the gate conductor 242 may be recessed by a recess depth rd below a top surface of the dielectric gate spacer 244. In case the contiguous semiconductor portion 230 and the gate conductor 242 comprise the same semiconductor material, the recess depth rd may be equal to or exceed the thickness of the contiguous semiconductor portion 230, i.e., the thickness of the top semiconductor layer 30. In this case, the initial thickness of the gate conductor 242 exceeds the thickness of the top semiconductor layer 30 so that the gate conductor 242 is present after the etch. In case the contiguous semiconductor portion 230 and the gate conductor 242 comprise different materials, the etch chemistry is selected so that a portion of the gate conductor 242 remains after the etch. In some cases, the etch chemistry may be selective to the material of the gate conductor 242 so that the recess depth rd is essentially zero.

Figure 18:
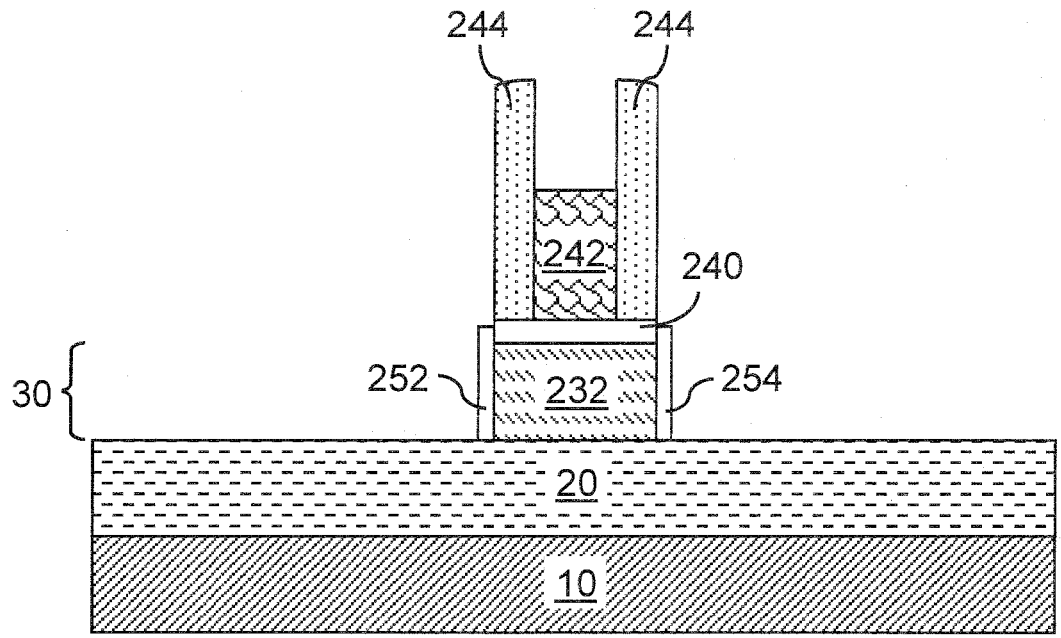

Referring to FIG. 18, a second dielectric material portion 252 and a third dielectric material portion 254 are formed directly on the exposed top surfaces of the semiconductor portion. The second dielectric material portion 252 is formed directly on a first sidewall of the semiconductor portion 232, and the third dielectric material portion 54 is formed directly on a second sidewall of the semiconductor portion 232.

The second dielectric material portion 252 and the third dielectric material portion 254 may comprise the same dielectric material as the second dielectric material portion 52 and the third dielectric material portion 54 of the first embodiment. The second dielectric material portion 252 and the third dielectric material portion 254 have the same thickness. The thickness of the second dielectric material portion 252 and the third dielectric material portion 254 may be from about 0.3 nm to about 2 nm to enable quantum tunneling of electrical current therethrough. Preferably, the thickness of the second dielectric material portion 252 and the third dielectric material portion 254 is from about 0.5 nm to about 1.2 nm. The buried insulator layer 20 and the first, second, and third dielectric material portions (240, 252, 254) collectively encapsulate the semiconductor portion 232.

Formation of the second dielectric material portion 252 and the third dielectric material portion 254 may be effected by deposition of a dielectric material layer followed by an anisotropic etch, or may be effected by thermal or plasma conversion of the material of the sidewalls of the semiconductor portion 232. If thermal or plasma conversion process is used to form the second dielectric material portion 252 and the third dielectric material portion 254, a thin dielectric layer (not shown) may be formed on the top surface of the gate conductor 242. In this case, the thin dielectric layer may be removed during a subsequent planarization process, or may be removed by a subsequent etch, which may be an anisotropic etch or an isotropic etch provided that all of the thin dielectric layer is removed, while adequate amount of the second dielectric material portion 252 and the third dielectric material portion 254 remain on the sidewalls of the semiconductor portion 232 to serve for their isolation purpose.

Figure 19:
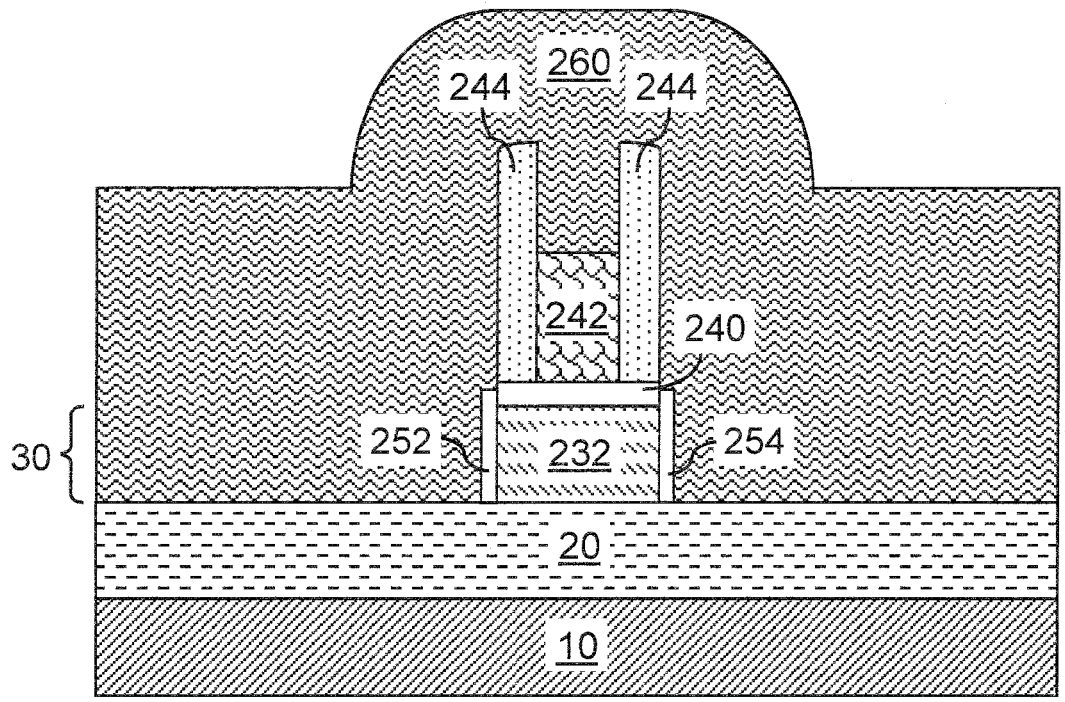

Referring to FIG. 19, a conductive material layer 260 is deposited over the top surfaces of the third exemplary semiconductor structure. The conductive material layer 260 may comprise the same material as the conductive material layer 60 of the first embodiment. The thickness of the conductive material layer 260, as measured directly above the top surface of the buried insulator layer 20, is greater than the sum of the thickness of the semiconductor portion 232, the thickness of the first dielectric material portion 240, and the thickness of the gate conductor 242.

Figure 20:
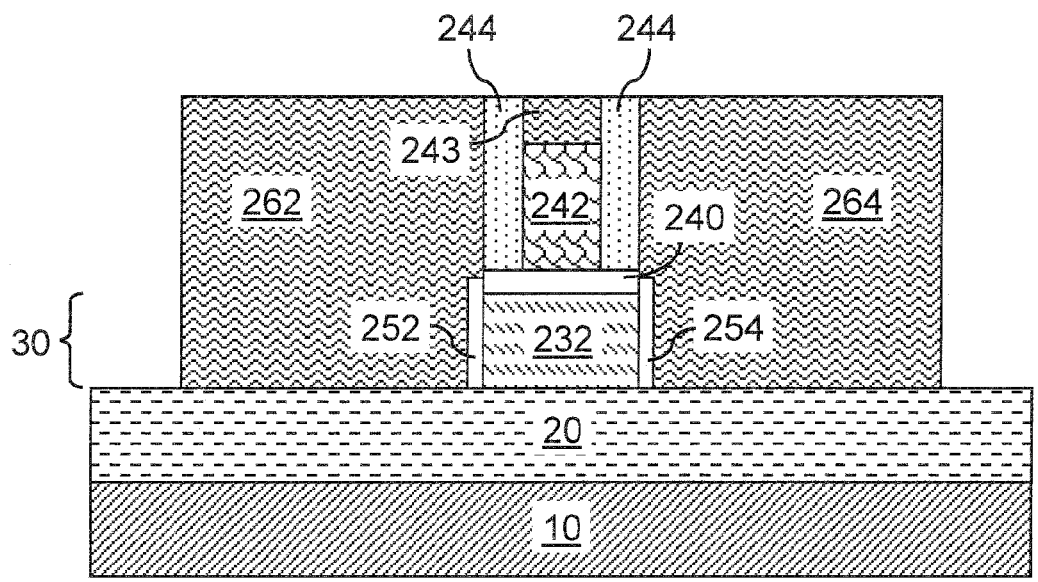

Referring to FIG. 20, the conductive material layer 260 is planarized. The planarization may stop above the top surface of the gate conductor 242 so that a gate conductor extension portion 243, which is a remaining portion of the conductive material layer 260, is formed directly above the gate conductor 242. The dielectric gate spacer 244 may be employed to control the end point of the planarization process, e.g., by allowing a fixed amount of removal after detection of the material of the dielectric gate spacer 244 during the planarization process. An upper portion of the dielectric gate spacer 244 may thus be polished during the planarization process. After planarization, the top surface of the gate conductor extension portion 243, the top surface of the dielectric gate spacer 244, and the top surface of the conductive material layer 260 are substantially coplanar and horizontal.

The conductive material layer 260 is subsequently lithographically patterned to form a source-side conductive material portion 262 abutting the second dielectric material portion 252 and a drain-side conductive material portion 264 abutting the third dielectric material portion 254. The source-side conductive material portion 262 and the drain-side conductive material portion 264 vertically abut the buried insulator layer 20.

Figure 21:
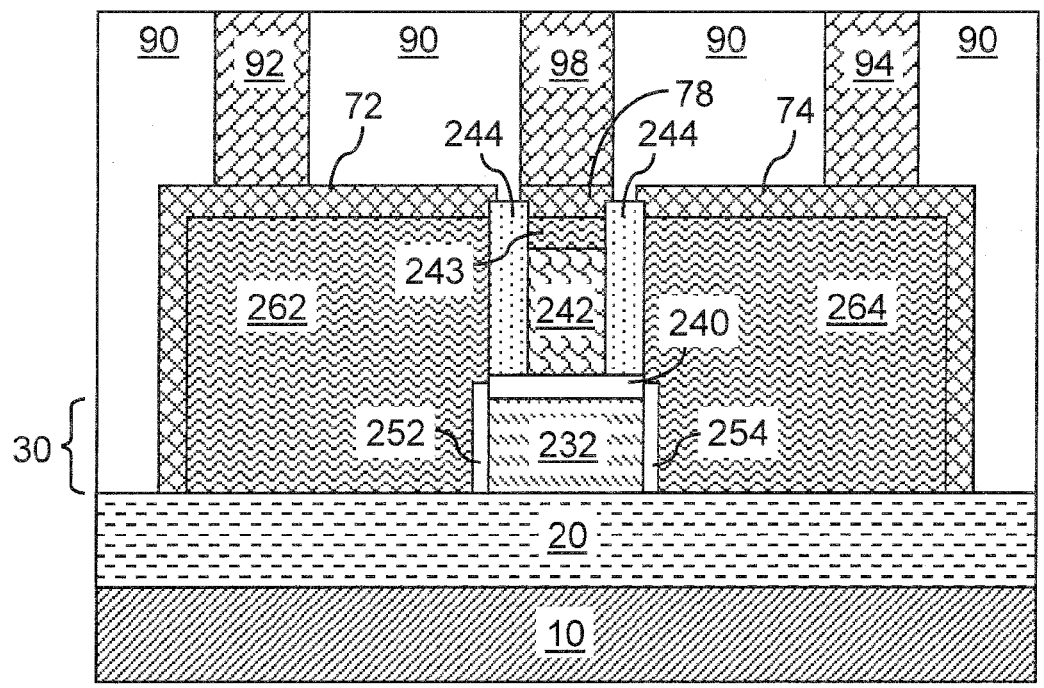

Referring to FIG. 21, metal semiconductor alloy regions are formed on exposed semiconductor surfaces of the third exemplary semiconductor structure. The metal semiconductor alloy regions may be formed in the same manner as in the first embodiment of the present invention.

A source-side metal semiconductor alloy region 72 is formed directly on the surface of the source-side conductive material portion 262 if the source-side conductive material portion 262 comprises a semiconductor material. The source-side metal semiconductor alloy region 72 also abuts the buried insulator layer 20. The source-side metal semiconductor alloy region 72 abuts one side of the dielectric gate spacer 244. A drain-side metal semiconductor alloy region 74 is formed directly on the surface of the drain-side conductive material portion 264 if the drain-side conductive material portion 264 comprises a semiconductor material. The drain-side metal semiconductor alloy region 74 also abuts the buried insulator layer 20. The drain-side metal semiconductor alloy region 74 abuts the other side of the dielectric gate spacer 244. A gate-side metal semiconductor alloy region 78 is formed directly on the top surface of the gate conductor extension portion 243 if the gate conductor extension portion 243 comprises a semiconductor material. The gate-side metal semiconductor alloy region 78 abuts the dielectric gate spacer 244.

A middle-of-line (MOL) dielectric layer 90 is formed over the gate-side metal semiconductor alloy region 78, source-side metal semiconductor alloy region 72, the drain-side metal semiconductor alloy region 74, the dielectric gate spacer 44, and the buried insulator layer 20. The MOL dielectric layer 90 may comprise the same material as in the first embodiment.

Contact via holes are formed in the MOL dielectric layer 90 and filled with metal to form various metal contacts. For example, a source-side contact via 92 vertically abutting the source-side metal semiconductor alloy region 72 and a drain-side contact via 94 vertically abutting the drain-side metal semiconductor alloy region 74 may be formed. Further, a gate-side contact via 98 vertically abutting the gate-side metal semiconductor alloy region 78 may be formed.

The electrical charge and the number of excitons in the semiconductor portion 32 are quantized. When the voltage on the gate conductor 242 removes electrical charges and excitons from the semiconductor portion 232, the electrical current through the source-side conductive material portion 262, the second dielectric material portion 252, the semiconductor portion 232, the third dielectric material portion 254, and the drain-side conductive material portion 264 is virtually non-existent. When the voltage on the gate conductor 242 is set to provide electrical charges and excitons in the semiconductor portion 232, electrical current tunnels through the second gate dielectric portion 252 and through the third gate dielectric portion 254. The tunneling current changes exponentially with the voltage on the gate conductor 242. Further, the tunneling current may also be controlled by the potential difference between the source-side conductive material portion 262 and the drain-side conductive material portion 264. Therefore, the semiconductor switching device in the third exemplary semiconductor structure of the present invention provides a low leakage switching device that provides effective switching even at low operational voltages, e.g., below 0.9 V.

Figure 22:
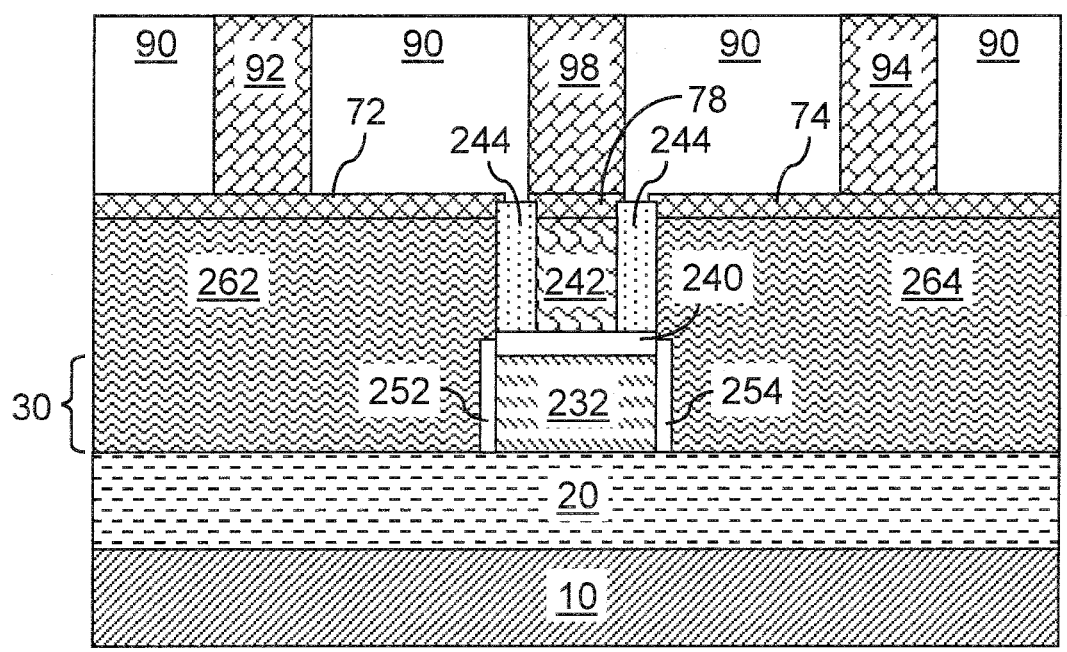
FIG. 22 is a vertical cross-sectional view of a variation of a third exemplary semiconductor structure according to the third embodiment of the present invention.

Referring to FIG. 22, a variation of the third exemplary semiconductor structure is shown, which is derived from the third exemplary semiconductor by modifying the planarization step corresponding to FIG. 20. Particularly, the planarization process completely removes the material of the conductive material layer 260 from above the gate conductor 242. Some of the material from the gate conductor 242 may be removed during the planarization step. After planarization, the top surface of the gate conductor 242, the top surface of the dielectric gate spacer 244, and the top surface of the conductive material layer 260 are substantially coplanar and horizontal. Subsequently, the gate-side metal semiconductor alloy portion 78 is formed directly on the gate conductor 242. The variation of the third exemplary semiconductor structure provides the same functionality as the third exemplary semiconductor structure of FIG. 21.

Figure 23:
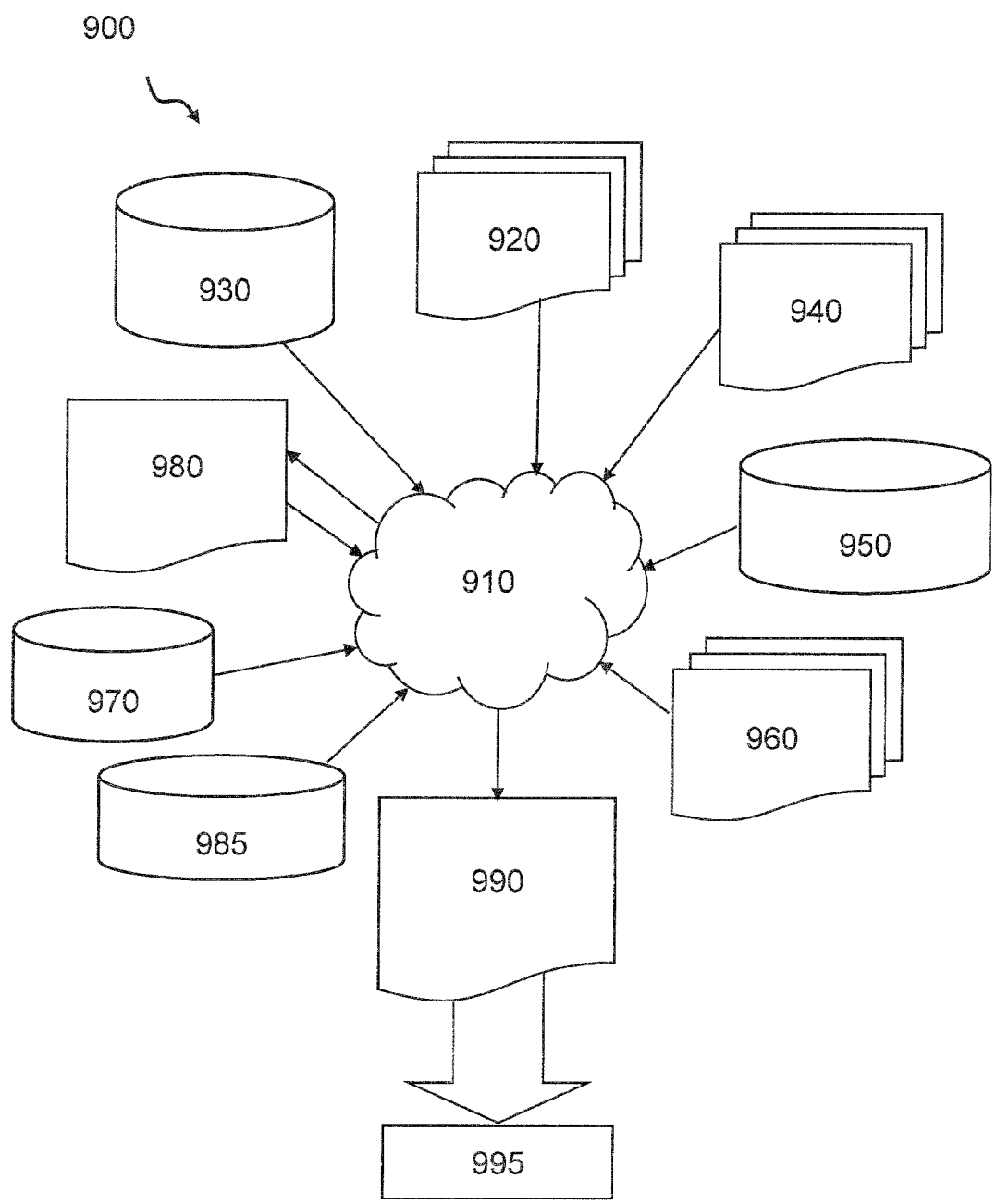
FIG. 23 is a flow diagram of a design process that may be used in design and manufacture of the semiconductor devices and circuits according to the present invention.

FIG. 23 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-22. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 23 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-22. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-22 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-22. In one embodiment, design structure 990 may comprise a compiled, executable HDL simulation model that functionally simulates the devices shown in FIGS. 1-22.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-22. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
an encapsulated semiconductor portion occupying an entirety of a volume defined by a set of surfaces, not directly contacting a source-side conductive material portion or a drain-side conductive material portion, configured to store quantized electrical charges therein, configured to enable quantum tunneling of an electrical current from or into each of said source-side conductive material portion and said drain-side conductive material portion, and including at least one dopant atom, and said set of surfaces comprises:
- a bottom surface of a first dielectric material portion having a first thickness and contacting a gate conductor,
- a bottom surface of a second dielectric material portion having a second thickness and vertically spacing said encapsulated semiconductor portion from said source-side conductive material portion,
- a bottom surface of a third dielectric material portion having said second thickness and vertically spacing said encapsulated semiconductor portion from said drain-side conductive material portion,
- side surfaces of at least one shallow trench isolation structure, and
- a top surface of an insulator layer, wherein each of said second and third dielectric material portions contiguously extends from one of first and second side surfaces of said first dielectric material portion at least to a periphery of said at least one shallow trench isolation structure.

2. The semiconductor structure of claim 1, wherein said first dielectric material portion, said second dielectric material portion, and said third dielectric material portion vertically abut a top surface of said encapsulated semiconductor portion at horizontal surfaces, and wherein said first dielectric material portion laterally abuts said second dielectric material portion and said third dielectric material portion.

3. The semiconductor structure of claim 1, further comprising a dielectric gate spacer laterally abutting said gate conductor, said source-side conductive material portion, and said drain-side conductive material portion and vertically abutting said first dielectric material portion, wherein a boundary between said first dielectric material portion and each of said second and third dielectric material portions is substantially vertically coincident with an outer sidewall of said dielectric gate spacer.

4. The semiconductor structure of claim 1, wherein a top surface of said gate conductor, a top surface of said source-side conductive material portion, and a top surface of said drain-side conductive material portion are substantially horizontal and coplanar.

5. The semiconductor structure of claim 1, further comprising:
- a gate-side metal semiconductor alloy region vertically abutting said gate conductor;
- a source-side metal semiconductor alloy region vertically abutting said source-side conductive material portion; and
- a drain-side metal semiconductor alloy region vertically abutting said drain-side conductive material portion.

6. A method of forming a semiconductor structure comprising:
- forming a semiconductor portion including at least one dopant atom directly on an insulator layer;
- forming at least one shallow trench isolation region laterally abutting and laterally surrounding said semiconductor portion;
- forming a stack of a first dielectric material portion and a gate conductor directly on a portion of a top surface of said semiconductor portion;
- forming second and third dielectric material portions directly on exposed top surfaces of said semiconductor portion, wherein, after formation of said second and third dielectric material portions, said semiconductor portion becomes an encapsulated semiconductor portion occupying an entirety of a volume defined by a set of surfaces, wherein said set of surfaces comprises:
  - a bottom surface of said first dielectric material portion,
  - a bottom surface of said second dielectric material portion,
  - a bottom surface of said third dielectric material portion,
  - side surfaces of said at least one shallow trench isolation structure, and
  - a top surface of said insulator layer, wherein each of said second and third dielectric material portions contiguously extends from one of first and second side surfaces of said first dielectric material portion at least to a periphery of said at least one shallow trench isolation structure;
- forming a source-side conductive material portion directly above said second dielectric material portion; and
- forming a drain-side conductive material portion directly above said third dielectric material portion,
wherein, upon formation of said source-side conductive material portion and said drain-side conductive material portion, said encapsulated semiconductor portion is configured to store quantized electrical charges therein, does not directly contact said source-side conductive material portion or said drain-side conductive material portion, and is configured to enable quantum tunneling of an electrical current from or into each of said source-side conductive material portion and said drain-side conductive material portion.

7. The method of claim 6, further comprising forming a dielectric gate spacer directly on sidewalls of said gate conductor, wherein said dielectric gate spacer abuts and overlies said first dielectric material portion.

8. The method of claim 7, wherein a boundary between said first dielectric material portion and each of said second and third dielectric material portions is substantially vertically coincident with an outer sidewall of said dielectric gate spacer.

9. The method of claim 6, wherein said first dielectric material portion, said second dielectric material portion, and said third dielectric material portion vertically abut a top surface of said encapsulated semiconductor portion at horizontal interfaces, and wherein said first dielectric material portion laterally abuts said second dielectric material portion and said third dielectric material portion.

10. The method of claim 6, further comprising:
- forming a gate-side metal semiconductor alloy region directly on said gate conductor;
- forming a source-side metal semiconductor alloy region directly on said source-side conductive material portion; and
- forming a drain-side metal semiconductor alloy region directly on said drain-side conductive material portion.

11. The semiconductor structure of claim 1, wherein an entirety of a bottom surface of said first dielectric material portion extending from said first side surface of said first dielectric material portion to said second side surface of said first dielectric material portion is in physical contact with a portion of a top surface of said encapsulated semiconductor portion.

12. The semiconductor structure of claim 11, wherein an entirety of a bottom surface of said encapsulated semiconductor portion is in physical contact with said top surface of said insulator layer.

13. The semiconductor structure of claim 12, wherein all side surfaces of said encapsulated semiconductor portion are in physical contact with said at least one shallow trench isolation region.

14. The semiconductor structure of claim 1, wherein an entirety of a bottom surface of said second dielectric material portion is planar, and an entirety of a bottom surface of said third dielectric material portion is planar.

15. The semiconductor structure of claim 1, wherein said first side surface of said first dielectric material portion is in physical contact with said second dielectric material portion, and said second side surface of said first dielectric material portion is in physical contact with said third dielectric material portion.

16. The method of claim 6, wherein an entirety of a bottom surface of said first dielectric material portion extending from said first side surface of said first dielectric material portion to said second side surface of said first dielectric material portion is in physical contact with a portion of a top surface of said encapsulated semiconductor portion after formation of said second and third dielectric material portions.

17. The method of claim 16, wherein an entirety of a bottom surface of said encapsulated semiconductor portion is in physical contact with said top surface of said insulator layer after formation of said second and third dielectric material portions.

18. The method of claim 17, wherein all side surfaces of said encapsulated semiconductor portion are in physical contact with said at least one shallow trench isolation region.

19. The method of claim 6, wherein an entirety of a bottom surface of said second dielectric material portion is planar upon formation of said second dielectric material portion, and an entirety of a bottom surface of said third dielectric material portion is planar upon formation of said third dielectric material portion.

20. The method of claim 6, wherein said first side surface of said first dielectric material portion is in physical contact with said second dielectric material portion upon formation of said second dielectric material portion, and said second side surface of said first dielectric material portion is in physical contact with said third dielectric material portion upon formation of said third dielectric material portion.

21. The method of claim 6, wherein said first dielectric material portion has a first thickness, and said second and third dielectric material portions have a second thickness.

* * * * *